US009658261B2

(12) United States Patent
Yu et al.

(10) Patent No.: US 9,658,261 B2
(45) Date of Patent: May 23, 2017

(54) CURRENT PATTERN MATCHING METHOD FOR NON-INTRUSIVE POWER LOAD MONITORING AND DISAGGREGATION

(71) Applicant: Tianjin University, Tianjin (CN)

(72) Inventors: Yixin Yu, Tianjin (CN); Bo Liu, Tianjin (CN); Bing Wang, Tianjin (CN)

(73) Assignee: Tianjin University, Tianjin (CN)

( * ) Notice: Subject to any disclaimer, the term of this patent is extended or adjusted under 35 U.S.C. 154(b) by 0 days.

(21) Appl. No.: 14/442,725

(22) PCT Filed: Nov. 8, 2013

(86) PCT No.: PCT/CN2013/086725
§ 371 (c)(1),
(2) Date: May 14, 2015

(87) PCT Pub. No.: WO2014/075581
PCT Pub. Date: May 22, 2014

(65) Prior Publication Data
US 2015/0309092 A1    Oct. 29, 2015

(30) Foreign Application Priority Data

Nov. 16, 2012    (CN) .......................... 2012 1 0466810

(51) Int. Cl.
*G01R 13/00*    (2006.01)
*G01R 21/00*    (2006.01)
(Continued)

(52) U.S. Cl.
CPC ........... *G01R 21/00* (2013.01); *G01R 21/133* (2013.01); *G01R 23/00* (2013.01); *H02J 3/24* (2013.01); *G01R 19/2513* (2013.01)

(58) Field of Classification Search
CPC ...................................................... G01R 21/00
(Continued)

(56) References Cited

U.S. PATENT DOCUMENTS

| 2011/0213739 A1 | 9/2011 | Benitez et al. |
| 2013/0138669 A1* | 5/2013 | Lu .......................... G06N 3/088 |
| | | 707/758 |

(Continued)

FOREIGN PATENT DOCUMENTS

| CN | 101282040 A | 10/2008 |
| CN | 101567559 A | 10/2009 |
| CN | 103001230 A | 3/2013 |

OTHER PUBLICATIONS

Jian Liang et al., Load Signature Study—Part ii: Disaggregation Framework, Simulation, and Application, <IEEE Transactions on Power Delivery>, Apr. 30, 2010, p. 561-569, vol. 25, No. 2.

(Continued)

*Primary Examiner* — Ricky Ngon
(74) *Attorney, Agent, or Firm* — Bei & Ocean; George G. Wang

(57) ABSTRACT

A harmonic-characteristics based current pattern matching method for the non-intrusive power load monitoring and disaggregation is provided in this present invention, on the basis of establishing the load signature database, which comprises electrical appliance registration and load state word space initialization, data acquisition and data preprocessing, feasible state word space search based on table looking-up, the optimal matching of current pattern, and display and output of the monitoring and disaggregation results. The method improves the accuracy of disaggregation, and can achieves exact identification of operating states of appliances, and also can reduce the cost.

2 Claims, 4 Drawing Sheets

(51) Int. Cl.
*H02J 3/24* (2006.01)
*G01R 23/00* (2006.01)
*G01R 21/133* (2006.01)
*G01R 19/25* (2006.01)

(58) Field of Classification Search
USPC .......................................................... 702/66
See application file for complete search history.

(56) References Cited

U.S. PATENT DOCUMENTS

2014/0018969 A1* 1/2014 Forbes, Jr. ................ H02J 3/32
                                                                                                       700/295
2014/0336960 A1* 11/2014 Haghighat-Kashani G06Q 10/04
                                                                                                       702/60

OTHER PUBLICATIONS

Alan Marchiori et al., Circuit-Level Load Monitoring for Household Energy Management, <Pervasive computing>, Mar. 31, 2011, p. 40-48.

* cited by examiner

CURRENT PATTERN MATCHING METHOD FOR NON-INTRUSIVE POWER LOAD MONITORING AND DISAGGREGATION

FIELD OF THE INVENTION

The present invention relates to the Advanced Metering Infrastructure (AMI) of smart grid, particularly, relates to a method for residential electricity monitoring in power system.

BACKGROUND OF THE INVENTION

Presently, with the rapid development of economy and society, power distribution reliability, power quality, carbon emission and energy efficiency of power system are facing unprecedented strict constraints, traditional power grid is transforming into Smart Grid. (Refer to: Yu Yinxin, Luan Wenpeng. *The smart grid of the 21st century. [EB/OL]*. http://news. sciencenet.cn. 2010-09-05). Wherein, the Advanced Metering Infrastructure (AMI) is the very first step for realizing power grid intellectualization, which bears the underlying task of the measurement, collection, storage and analysis of multi-aspect electrical information for the entire electrical grid, and is the foundation of the implementation of other (upper) smart grid functions, such as power grid fault location and self-healing, demand side management and real-time load balancing, voltage stability control, accurate load forecasting and modeling, real-time power system simulation analysis, etc. Electricity power load monitoring and analysis is one of the most important parts of advanced metering system, wherein the significance of residential electricity monitoring is that: on one hand, the customers may understand the details of the power consumption and prompt their power consumption habits, and eventually achieve cutting the electricity bills; on the other hand, since residential load has strong controllability and great potential of friendly cooperation with the power grid, for instance, energy storage type load such as electric water heater and air conditioner, and delayed type load such as washing machine and electric kettle, customers can respond to the demand of power grid accordingly via electricity monitoring, which helps to achieve the functions of demand side management such as "peak load shifting", and eventually benefits the grid operation.

Traditional residential electricity monitoring equips every appliance with one sensor to track its power state, i.e. electric power, and operating state (for instance, air-conditioner has two operating state of cooling and heating with different power.), which belongs to "intrusive" load monitoring solution. However, the installation, debugging and maintenance of a large number of sensors with digital communication need large expenditure, moreover, too many sensors would lower the reliability of the monitoring system and the appliances as well. George Hart first formally present Non-Intrusive Load Monitoring System in his paper of "G. W. Hart. *Nonintrusive appliance load monitoring [J]. Proceedings of IEEE*, 1992, 80(12): 1870-1891", the basic principles can be summarized as shown in FIG. 1. The main functional blocks of the system are enclosed in the dashed box of FIG. 1, wherein, the data acquisition module is for sampling the terminal voltage and total current at the supply access, the data preprocessing module is for filtering and denoising voltage and current waveform and operating other operations for load electrical feature extraction, such as harmonic analysis of voltage and current signal, phase correction for the current waveform and so on; and the load event detection and feature extraction module is for extracting the required load signatures of the monitoring method from the measured terminal voltage and total current on the basis of load event detection, such as steady-state real power and reactive power, transient current peak-value, transient current RMS value and so on, and this module has a critical impact on the monitoring performance. Finally effective monitoring method is utilized to complete the total load composition analysis and electrical power state identification, and to achieve maintenance and management functions of the monitoring system. In addition, some other extending functions the system may have are also shown in the figure, such as interactive operation, control command input and output, system reporting and so on.

Non-intrusive power load monitoring scheme analyzes the voltage and total current sampled from the access of user power supply to determine the status of each electric appliances indoor. This scheme can not only reduce the monitoring cost and simplify operation, but also improve the reliability of the monitoring system, moreover, it can simplify the work of collecting detail data of power consumption for utilities, and instruct the customers to optimize the power consumption simply and easily as well.

In the prior art, transforming the load operating states, such as start-up and shut-down, are treated as load event, event-related steady-state features (for instance, the steady-state power step, refer to: (1) G. W. Hart. *Nonintrusive appliance changes start, stop and other working conditions collectively load monitoring[J]. Proceedings of IEEE*, 1992, 80(12): 1870-1891; (2) H. Pihala. *Non-intrusive appliance load monitoring system based on a modern kWh-meter[R]. Technical Research Center of Finland, ESPOO*, 1998; (3) Christopher E. Reeg, Thomas J. Overbye. *Algorithm development for Non-Intrusive Load Monitoring for Verification and Diagnostics [C]. North American Power Symposium (NAPS)*, 2010, :1-5; ((4) Berges, et al. *Enhancing electricity audits in residential buildings with nonintrusive load monitoring[J]. Journal of Industrial Ecology*, 2010, 14(5):844-858; (5) Ming Dong, et al. *An Event Window Based Load Monitoring Technique for Smart Meters[J]. IEEE Transactions on Smart Grid*, 2012, 3(2):787-796) or transient features (for instance, transient spectral envelope pattern, refer to: (1) Steven B. Leeb, James. L. Kirtley. *A Multiscale Transient Event Detector for Nonintrusive Load Monitoring [J]. International Conference on Industrial Electronics, Control, and Instrumentation*, 1993, 1:354-359; (2) Steven B. Leeb, Steven R. Shaw, James L. Kirtley. *Transient event detection in spectral envelope estimates for nonintrusive load monitoring [J]. IEEE Transactions on Power Delivery*, 1995, 10 (3):1200-1210; (3) S. R. Shaw, et al. *Nonintrusive Load Monitoring and Diagnostics in Power Systems[J]. IEEE Transactions on Instrumentation and Measurement*, 2008, 57(7): 1445-1454) are used to identify which appliance of the total load generating the detected load event, and further to realize non-intrusive load monitoring. Among existing achievement, based on the works of "G. W. Hart. *Nonintrusive* 15 *appliance loadmonitoring [J]. Proceedings of IEEE*, 1992, 80(12): 1870-1891", "Christopher E. Reeg, Thomas J. Overbye. *Algorithm development for Non-Intrusive Load Monitoring for Verification and Diagnostics[C]. North American Power Symposium (NAPS)*, 2010, :1-5" improved the monitoring performance via considering the feature of typical operating time period. Ming Dong, et al. "*An Event Window Based Load Monitoring Technique for Smart Meters[J]. IEEE Transactions on Smart Grid*, 2012, 3(2):787-796" proposed the concept of load event window, and on the basis of load characteristics parameterization, provided a linear load recognition classifier in the form of parameter equation, which has a high detection accuracy. However, determining the constant parameters of the classifier equations requires statistical analyzing a large number of actual data measured on site, inappropriate values would greatly affect the recognition accuracy. S. R. Shaw, et al. "*Nonintrusive Load Monitoring and Diagnostics in Power Systems[J]. IEEE Transactions on Instrumentation and Measurement*, 2008, 57(7): 1445-1454" realized the parameterization of transient power spectral pattern, which can be used to identify those individual appliances belonging to the same class, while with different transient waveform parameters. In summary, as to such event-based load monitoring methods, due to switching the operating states of different appliances are not often independently, different load events may happen simultaneously or sequentially to cause the unique characteristics of individual appliance to be hidden or just disappear, and thus resulting in incorrect identification results. For short duty-cycle appliance, the loss of load events between two consecutive measurement points may produce its identification errors. In addition, event-based methods cannot identify always-on appliances, and has lower monitoring accuracy for appliances with multiple operating states and with continuously variable power. In the reference of Li Peng, Yu Yinxin. "*Nonintrusive Method for On-Line Power Load Decomposition[J]. Journal of Tianjin University*, 2009, 42(4):303-308.", it puts aside the concepts of load events, based on the fact that any steady-state total load current can be approximately estimated by a linear superposition of the steady-state currents of the major types of electrical equipment inside the load, and uses optimization method to achieve the optimal matching of the actual total load current pattern (current harmonic-characteristics) with the estimated one, and thus obtaining current weight coefficients of various types of electrical equipment, and realizing on-line disaggregation of the total power. The proposed method effectively solves the above-described problems existing in the load event-based methods. Nevertheless, if the current waveforms of different appliances are similar, the total power disaggregation accuracy will decrease, thus proper appliance classification is required in advance, and the proposed method fails to satisfactorily resolve the problem of identification of appliance operating state. Literature "(1) Yi-Sheng Lai, Yung-Chi Chen, Shiao-Li Tsao, Tzung-Cheng Tsai. *A novel search scheme for non-intrusive load monitoring systems[C]*. 2012 IEEE International Conference on Industrial Technology (ICIT), 2012: 102-107" and literature "(2) Jian Liang, Ng, S., Kendall, G., Cheng, J. *Load Signature Study—Part II_Disaggregation Framework, Simulation, and Applications [J]. IEEE Transactions on Power Delivery*, 2010, 25(2): 561-569" are all relate to comprehensive non-intrusive load monitoring method integrating various load characteristics generated from transient process and steady-state operation, generally this kind of method provides higher identification and monitoring accuracy. However, higher sampling frequency (e.g. involving transient characteristics) of the data acquisition module and higher performance requirements of microprocessors would increase the overall cost and reduce the practicability of the monitoring methods.

SUMMARY OF THE INVENTION

Aiming at solving the remaining problems of the available technology, the present invention relates to a harmonic-characteristics based current pattern matching method for the non-intrusive power load monitoring, and establishes an economical, practical and innovative table looking-up method for monitoring the appliance power state (i.e. electric power) and operating state. The method can be generally used for it merely rely on the inherent statistical properties of the steady-state current pattern produced by appliance load during its normal operation and the steady-state active power and reactive power. Moreover, the invention puts forward a new concept of "load state word vector" in order to facilitate the realization of the proposed method. The present invention realizes the disaggregation of the total power by means of the optimal matching of the actual total load current pattern (i.e. current harmonic-characteristics) with the estimated one, and can effectively solve the problem existing in the prior art that if the current waveforms of different appliances are similar, the total power disaggregation accuracy will decrease, thereby when the current waveforms of different appliances have larger similarity, the disaggregation accuracy would not decrease, thus improves the disaggregation precision, and precisely recognizes the different operating states of appliance. Moreover, since the suggested method utilize table looking-up method instead of optimization algorithm to achieve monitoring, the requirements for the computing performance of the microprocessor in the monitoring system can be lowered, and thus the cost is effectively reduced.

In order to solve the technical problems mentioned above, the present invention provides a harmonic-characteristics based current pattern matching method for the non-intrusive power load monitoring, the technical scheme is as follows:

Establishing a load signature database which comprising the following load characteristic information:

(1) The power state and operating state of different appliances under the fundamental wave reference voltage $U_{ref}$;

(2) The steady-state current harmonic parameters of each operating state of different appliances;

and comprising the following steps:

Step of Electrical Appliance Registration and Initialization of Load State Word Space:

1) Determining the ingredient appliances in the total load, and acquiring the load characteristic information of each appliance inside the total load from the load signature database, and achieving the electrical appliance registration.

2) Statistical analyzing all the operating states of the total load, and storing the results in the orderly linear table of [state] in the form of state word to finish the initialization of load state word space $\Omega_{SW}$.

Step of Data Acquisition and Data Preprocessing:

This step includes sampling the load terminal voltage and steady-state total current, and denoising and harmonic analysis of the measured voltage and total current signal, thereby the following results are obtained:

The measured total fundamental active power $P_I^1(t)$ is of:

$$P_I^1(t) = U_I I_1 \cos(\theta_{I1}) \quad (6)$$

The measured total fundamental reactive power $Q_I^1(t)$ is of:

$$Q_I^1(t) = U_I I_1 \sin(\theta_{I1}) \quad (7)$$

The measured unit total current pattern $I_f(P_I^1(t), Q_I^1(t))$ is of:

$$I_f(P_I^1(t), Q_I^1(t)) = (1 \angle \theta_{I1}, \ldots, \alpha_{Ih} \angle \theta_{Ih}, \ldots, \alpha_{IH} \angle \theta_{IH})^T \quad (15)$$

In equation (6) and (7), $U_1$ represents the fundamental wave RMS-value of the measured load terminal voltage u(t), $I_1$ represents the fundamental wave RMS-value of the measured load total current $i_l(t)$; $\theta_{l1}$ represents the initial phase angle of the fundamental wave of current $i_l(t)$ relative to the fundamental phase angle of load terminal voltage;

In equation (15), $\alpha_{lh}$ represents per unit value of the h-th harmonic amplitude of current $i_l(t)$ with its fundamental amplitude as base value, so $\alpha_{l1}=1$; $\theta_{lh}$ represents the initial phase angle of the h-th harmonic of current $i_l(t)$ relative to the fundamental phase angle of load terminal voltage;

Step of Feasible State Word Space Search Based on Table Looking-Up:

By searching the orderly linear table [state], initial selection of the total load operating state are carried out in the load state word space $\Omega_{SW}$ based on the measured fundamental active total power $P_l^1(t)$ and the measured fundamental reactive total power $Q_l^1(t)$, and consequently the feasible state word space $\Omega_{SW}(P_l^1(t), Q_l^1(t)) \subset Z^N$ meeting the fundamental total power constraints is obtained; wherein, Z represents integer number space.

Step of the Optimal Matching of Current Pattern:

The objective function for the optimal matching of current pattern is as follows:

$$\min_{\forall SW_k \in \Omega_{SW}(P_l^1(t), Q_l^1(t))} \left\| I_l(P_l^1(t), Q_l^1(t)) - \hat{I}_l(SW_k, U_1) \right\|^2 \quad (16)$$

In equation (16), $\|\cdot\|$ represents the $L_2$ norm;

In the feasible state word space $\Omega_{SW}(P_l^1(t), Q_l^1(t)) \subset Z^N$, a state word vector $SW_{min}(t)$ bringing the objective function for the optimal matching of current pattern to obtain the minimum value is searched, which serves as the optimal estimation of the current actual operating state of the total load, then the accordingly appliance operating state is identified, and the $P_{min}^1(t)$ which exclusively corresponds to the $SW_{min}(t)$ serves as the optimal estimation of the current power state of the total load, so far the disaggregation of total fundamental active power is completed;

Step of Display and Output of the Monitoring and Disaggregation Results:

Finally, displaying and outputting the power state (i.e. electric power) and operating state of each appliance inside the total load are performed.

Compared with the prior art, the present invention has the following beneficial effects and advantages:

Similar to the literature of Li Peng, Yu Yinxin. (*Nonintrusive Method for On-Line Power Load Decomposition[J]. Journal of Tianjin University*, 2009, 42(4):303-308), the present invention also utilizes the optimal matching of the actual total load current pattern (i.e. current harmonic-characteristics) with the estimated one to realize the disaggregation of the total power, instead of employing the optimization algorithm, the invention has built a novel table looking-up method to solve the optimization problem. The current pattern matching method of the present invention not only solves the problem involved in the existing techniques that if the current waveforms of different appliances are similar, the total power disaggregation accuracy will decrease, thus proper appliance classification in advance is necessary, and the problem of identification of appliance operating state hasn't been resolved satisfactorily. Although the current waveforms of different appliances have great similarity, the disaggregation accuracy of the present invention would not decrease, so the disaggregation precision is improved, and different operating states of one appliance can be recognized accurately. Moreover, the method of the present invention also has the following features:

(1) taking individual appliance as monitoring object, and appliance load classification in advance is not required;

(2) merely relying on the inherent statistical properties of the steady-state current-pattern produced by appliance load during its normal operation and the steady-state active power and reactive power, consequently it can be generally used;

(3) not sensitive to the reasonable load power fluctuations, and can distinguish load operating states with similar power levels;

(4) accurately recognizing the operating state for single-state appliance or multi-state appliance;

(5) having high disaggregation accuracy of the total power, and the relative error lies within 5%.

Besides, in the present invention, microprocessor in the monitoring system is mainly responsible for the following tasks:

(1) performing harmonic analysis of load terminal voltage and total current, which only takes a small amount of calculation for the 32-point fourier transform per cycle that is enough for current harmonic-characteristics extraction;

(2) traversing orderly linear table [state], and time-consuming measurement of looking up the orderly linear table can be logarithmic order $o(\log_2 n)$, which leads to superior performance;

(3) on-line calculating the estimation of total current pattern. Since the number of elements in the set $\Omega_{SW}(P_l^1(t), Q_l^1(t))$ can only be 5~10% of that in the feasible state word space $\Omega_{SW}$, the required calculation amount for the floating point arithmetic is small.

Comprehensively considering the above three points, the present invention requires low computing performance for the microprocessor of the monitoring system, and the suggested method can be easily applied to smart meters. The microprocessor unit (CPU) in the available smart can meet the above need, on the basis of expanding the necessary external storage space for the orderly linear table [state], the smart meters can be equipped with the function of non-intrusive power load monitoring and disaggregation, from which the project benefits of the present invention can be expected.

DETAILED DESCRIPTION OF THE INVENTION

Figure 1:
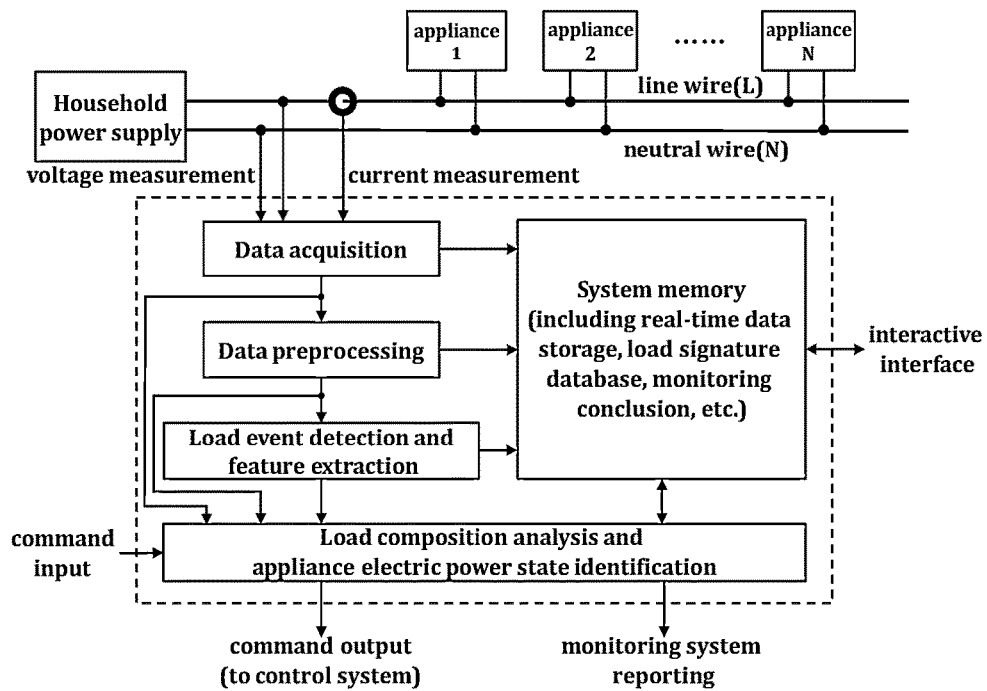
FIG. 1 shows the basic schematic diagram of non-intrusive power load monitoring and disaggregation system.

The present invention will be further described in detail combining with specific embodiments.

The present invention adopts individual appliance as monitoring object, and the power state (i.e. electric power) and operating state (for instance, air conditioner has two operating state of cooling and heating with different power levels) of each appliance inside the total load as monitoring target, and the following two basic hypotheses are put forward:

Hypothesis 1: Under normal circumstances, a deterministic relationship exists between the fundamental active power of each appliance in the preset operating state (and the corresponding fundamental reactive power) and the load terminal voltage, which can be described via active power only (refer to: H. Pihala. Non-intrusive appliance load monitoring system based on a modern kWh-meter[R]. Technical Research Center of Finland, ESPOO, 1998.);

Hypothesis 2: Under the given voltage, a one-to-one corresponding relationship exists between the appliance operating state and its steady-state current harmonic-characteristics. (refer to: Li Peng, Yu Yinxin. Nonintrusive Method for On-Line Power Load Decomposition [J]. Journal of Tianjin University, 2009, 42(4):303-308.).

Based on the above two hypotheses, the present invention, namely the harmonic-characteristics based current pattern matching method for the non-intrusive power load monitoring and disaggregation, is required to establish a load signature database including the two following items:

The Power State and Operating State of Different Appliances Under the Fundamental Wave Reference Voltage $U_{ref}$:

Under the fundamental wave reference voltage $U_{ref}$, different appliances are measured to determine all possible steady states with different electric power, and different levels of electric power are defined as the corresponding power states, the reference power denotes as $P_{ref}$. Different power states corresponds to different operating state, and if some appliance has the same electric power level under different physical states, then these different physical states are jointly defined as one operating state; taking the microwave oven listed in the table 1 as the example, the microwave oven has three different physical states of high-fire heating, medium-fire heating and low-fire heating, but these three operating states have the same power level, the only difference lies in the on/off duty-cycle while heating, so the microwave oven just takes the high-fire heating state as the operating state.

The Steady-State Current Harmonic Parameters of Each Operating State of Different Appliances:

The steady-state current harmonic parameters are obtained via harmonic analysis of the measured terminal voltages and steady-state currents of different appliances; shown in equation (4), the matrix $H_{ai}$ of current harmonic parameters of appliance ai is $$H_{ai} = \begin{bmatrix} 1\angle\theta_{1,1} & \ldots & 1\angle\theta_{1,s(i)} & \ldots & 1\angle\theta_{1,Si} \\ \vdots & \ldots & \vdots & \ldots & \vdots \\ \alpha_{h,1}\angle\theta_{h,1} & \ldots & \alpha_{h,s(i)}\angle\theta_{h,s(i)} & \ldots & \alpha_{h,Si}\angle\theta_{h,Si} \\ \vdots & \ldots & \vdots & \ldots & \vdots \\ \alpha_{H,1}\angle\theta_{H,1} & \ldots & \alpha_{H,s(i)}\angle\theta_{H,s(i)} & \ldots & \alpha_{H,Si}\angle\theta_{H,Si} \end{bmatrix} \quad (4)$$

In equation (4), assuming the appliance ai having Si operating states except for the off-state, then the matrix $H_{ai}$ has $Si \in Z$ columns, wherein $s(i) \in \{1, 2, \ldots, Si\}$; H represents the maximum harmonic order of $H_{ai}$, h represents harmonic order, wherein $h \in \{1, 2, \ldots, H\}$; $\alpha_{h,s(i)}$ represents the per unit value of the h-th harmonic amplitude of the steady-state current under the state s(i) of appliance ai with its fundamental amplitude as base value, so $\alpha_{1,s(i)}=1$; $\theta_{h,s(i)}$ represents the initial phase angle of the h-th harmonic of the steady-state current under state s(i) of appliance ai relative to the fundamental phase angle of appliance terminal voltage measured.

Figure 2:
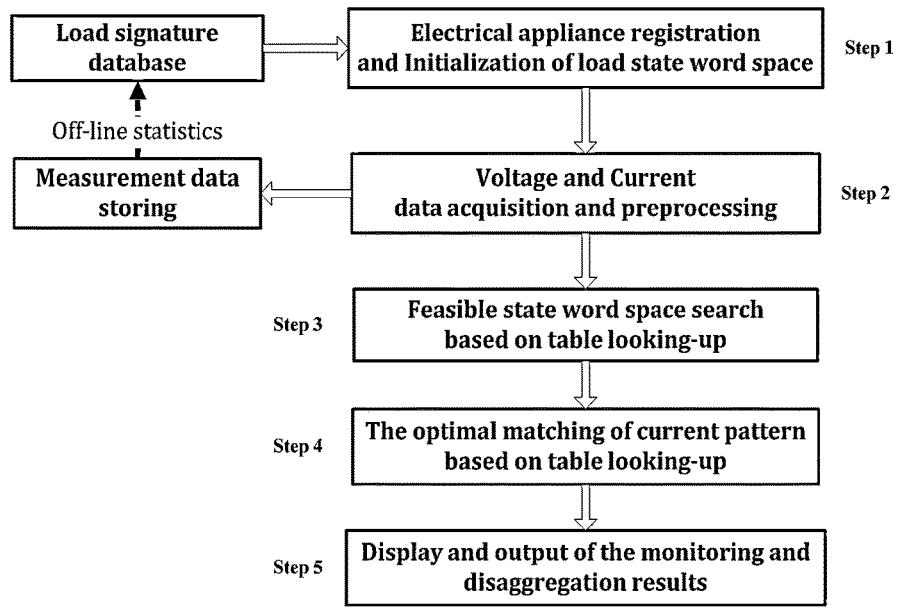
FIG. 2 shows the functional flow diagram of the non-intrusive power load monitoring and disaggregation system proposed by the present invention.

The present invention, namely the harmonic-characteristics based current pattern matching method for the non-intrusive power load monitoring and disaggregation, comprises the following steps, and FIG. 2 shows the functional flow diagram of the non-intrusive power load monitoring and disaggregation system of the present invention:

I. Step of Electrical Appliance Registration and Initialization of Load State Word Space:

1) determining the appliances inside the total load, and acquiring the load characteristic information of each appliance from the load signature database, the information includes: (1) the power state and operating state of each appliance under its fundamental wave reference voltage $U_{ref}$; (2) the steady-state current harmonic parameters of each operating state of each appliance inside the total load, and thus achieving the electrical appliance registration.

If the total load comprises the electrical appliances of washing machine, air conditioner, microwave oven, and induction cooker, then the information on the power state and operating state of each appliance can be obtained after finishing electrical appliance registration. The following table 1 is showing the load characteristic information of the appliances.

TABLE I

Statistical table of the load characteristic information ($U_{ref}$ = 220 V)

| Power (W)/<br>Power State | Washing<br>machine/X | Air<br>conditioner/<br>K | Microwave<br>oven/W | Induction<br>cooker/D |
|---|---|---|---|---|
| Off-State 0 | 0 | 0 | 0 | 0 |
| Power State 1 | 260/<br>washing | 510/<br>cooling | 1374/<br>high-fire | 1023/<br>rice<br>cooking |
| Power State 2 | 200/<br>dehydration | 800/<br>heating | NULL | 1479/<br>hot-pot<br>cooking |
| Power State 3 | NULL | NULL | NULL | 1880/<br>water<br>boiling |
| Active power<br>correction index | 1.2 | 1.2 | 1.5 | 2 |

Remark: The three different states of high-fire heating, medium-fire heating and low-fire heating of microwave oven have same electric power, only different in power on-off duty ratio, so only the high-fire heating state of microwave oven is provided in the table.

2) Statistically analyzing all possible operating states (i.e. the combination of operating states of all appliances inside the total load) of the total load, and storing the results in the orderly linear table of [state] in the form of state word, and consequently the task of initialization of load state word space $\Omega_{SW}$, can be finished.

In the present invention, the total load power state is expressed as the power vector consisting of fundamental powers consumed by N appliances, as shown in equation (1) and (2), the power vectors are active power vector $P^1(t) \in R^N$ and reactive power vector $Q^1(t) \in R^N$ (R represents real number space) respectively, the elements thereof are respectively the fundamental active power or reactive power of N appliances in the respective power states at time t. For the given total load (i.e. the combination of the power states of N appliances), there is a one-to-one corresponding relationship between $P^1(t)$ and $Q^1(t)$, therefore the total load power state can be represented by active power vector $P^1(t)$ only.

$$P^1(t)=(P_1^1, \ldots P_i^1, \ldots, P_N^1)^T \qquad (1)$$

$$Q^1(t)=(Q_1^1, \ldots Q_i^1, \ldots, Q_N^1)^T \qquad (2)$$

In equation (1) and (2), superscript "1" represents fundamental wave, the same hereinafter, N represents the number of appliances inside the total load, i represents appliance ai, i∈{1, 2, ..., N}.

Furthermore, if s(i)∈Z (Z represents integer number space) represents the s(i)-th operating state of appliance ai, and since each appliance can only be in one operating state at time t, thus the total load operating state at time t can be represented by a N-dimensional state word vector SW(t) ∈$Z^N$, the elements thereof respectively represent the operating states of N appliances, as shown in equation (3):

$$SW(t)=(s(1), \ldots, s(i), \ldots, s(N))^T \qquad (3)$$

In equation (3): if appliance ai is in off-state, then s(i)=0.

As mentioned above, the $P^1(t)$ (or $Q^1(t)$) corresponds to one total load operating state SW(t) exclusively, and vice versa. If the load characteristic information as listed in table 1 is provided, then vector $P^1(t)=(260,0,1374,1479)^T$ can be written out, and $SW(t)=(1,0,1,2)^T$ accordingly, which represents (at time t) the washing machine is in washing-state, air conditioner is in off-state, microwave oven is in high-fire heating state, and induction cooker is in hot-pot cooking state; if providing $SW(t)=(0,1,0,3)^T$ firstly, and $U_{ref}=220V$, then $P^1(t)=(0,510,0,1880)^T$ accordingly, and summing all the elements of $P^1(t)$ to obtain the reference value of total fundamental active power is 2390 W. Since the total load operating state can be defined by SW(t) exclusively, in order to save the storage space, state word vectors which represent all the possible operating states of the total load correspondingly are saved in the orderly linear table [state] sequentially in the ascending order according to the reference values of total fundamental active power corresponding to each state word vector, and consequentially the state word space $\Omega_{SW} \subset Z^N$ is formed, i.e. state space for short, wherein, Z represents integer number space.

II. Step of Data Acquisition and Data Preprocessing:

This step includes sampling the load terminal voltage and steady-state total current, and denoising and harmonic analysis of the measured voltage and total current signal, thereby the following results are obtained:

The measured total fundamental active power $P_I^1(t)$ is of:

$$P_I^1(t)=U_1 I_1 \cos(\theta_{I1}) \qquad (6)$$

The measured total fundamental reactive power $Q_I^1(t)$ is of:

$$Q_I^1(t)=U_1 I_1 \sin(\theta_{I1}) \qquad (7)$$

The measured unit total current pattern $I_i(P_I^1(t), Q_I^1(t))$ is of:

$$I_i(P_I^1(t),Q_I^1(t))=(1 \angle \theta_{I1}, \ldots, \alpha_{Ih} \cdot \angle \theta_{Ih}, \ldots, \alpha_{IH} \angle \theta_{IH})^T \qquad (15)$$

In equation (6) and equation (7): $U_1$ represents the fundamental wave RMS-value of the measured load terminal voltage u(t), I1 represents the fundamental wave RMS-value of the measured load total current $i_i(t)$; $\theta_{I1}$ represents the initial phase angle of the fundamental wave of current $i_i(t)$ relative to the fundamental phase angle of load terminal voltage;

In equation (15), $\alpha_{Ih}$ represents per unit value of the h-th harmonic amplitude of current $i_i(t)$ with its fundamental amplitude as base value, so $\alpha_{I1}=1$; $\theta_{Ih}$, represents the initial phase angle of the h-th harmonic of current $i_i(t)$ relative to the fundamental phase angle of load terminal voltage.

III. Step of Feasible State Word Space Search Based on Table Looking-Up:

By searching the orderly linear table [state], initial selection of the total load operating state are carried out in the state word space $\Omega_{SW}$ based on the measured total fundamental active power $P_I^1(t)$ and the measured total fundamental reactive power $Q_I^1(t)$, and consequently the feasible state word space $\Omega_{SW}(P_I^1(t),Q_I^1(t)) \subset Z^N$ meeting the fundamental total power constraints is obtained, wherein, Z represents integer number space.

1) Under the measured fundamental terminal voltage $U_1$, the method for computing the estimation vector consisting of the fundamental active power and reactive power of each appliance, which is necessary for the initial selection of the total load operating state:

Due to the voltage fluctuation of power grid, the actual operating voltage of appliance may be not $U_{ref}$; according to the measured fundamental voltage $U_1$ of the load, the reference value of active power (stored in the load signature database) under $U_{ref}$ is revised to obtain the estimation of actual active power of each appliance, as shown in equation (8):

$$P(U_1)=P_{ref}(U_1/U_{ref})^{\gamma_P} \qquad (8)$$

In equation (8), $\gamma_P$ represents the fundamental active power correction index of appliances, which can be obtained via statistical analysis of the measured data, $P(U_1)$ represents estimation of actual active power of appliance under the measured fundamental terminal voltage $U_1$.

Under the measured fundamental terminal voltage $U_1$, the estimation vector of fundamental active power can be calculated according to the state word $SW_k$, denoted as $P^1(SW_k, U_1) \in R^N$. According to the table 1 and equation (7), assuming $SW_k=(1,1,0,2)^T, U_1=221.5V$, then $P^1(SW_k,U_1)=(262.1, 514.2,0,1499)^T$, (the value of $\gamma_P$ for each appliance is shown in table 1).

Furthermore, randomly selecting the k-th state word vector $SW_k$ from the orderly linear table [state], where k represents the serial number of the state word $SW_k$ in the table [state](the same hereinafter). According to the equation (3), the operating state of appliance ai in the vector $SW_k$ is s(i), and then the matrix of current harmonic parameters $H_a(SW_k)$ exclusively corresponding to the vector $SW_k$ can be obtained, as shown in equation (5):

$$H_a(SW_k) = \begin{bmatrix} 1\angle\theta_{1,s(1)} & \cdots & 1\angle\theta_{1,s(i)} & \cdots & 1\angle\theta_{1,s(N)} \\ \vdots & \cdots & \vdots & \cdots & \vdots \\ \alpha_{h,s(1)}\angle\theta_{h,s(1)} & \cdots & \alpha_{h,s(i)}\angle\theta_{h,s(i)} & \cdots & \alpha_{h,s(N)}\angle\theta_{h,s(N)} \\ \vdots & \cdots & \vdots & \cdots & \vdots \\ \alpha_{H,s(1)}\angle\theta_{H,s(1)} & \cdots & \alpha_{H,s(i)}\angle\theta_{H,s(i)} & \cdots & \alpha_{H,s(N)}\angle\theta_{H,s(N)} \end{bmatrix} \qquad (5)$$

In equation (5), $H_a(SW_k)$ has N columns. Assuming the operating state s(i) of appliance ai in state word vector $SW_k$ isn't equal to zero, then the i-th column of the matrix $H_a(SW_k)$ is derived from the s(i)-th column of the matrix $H_{ai}$; If s(i)=0, the i-th column of the matrix $H_a(SW_k)$ is zero vector.

Utilizing the phase angle parameters of fundamental wave of each appliance in $H_a(SW_k)$, the estimation vector of fundamental reactive power $Q^1(SW_k,U_1) \in R^N$ corresponding to $P^1(SW_k,U_1) \in R^N$ can be calculated according to the equation (9):

$$Q_{s(i)}^{U_1} = P_{s(i)}^{U_1} \cdot \tan \theta_{1,s(i)} \quad (9)$$

In equation (9), $\theta_{1,s(i)}$ is taken from the parameter matrix $H_a(SW_k)$, $P_{s(i)}^{U_1}$ and $Q_{s(i)}^{U_1}$ are respectively the i-th element of $P^1(SW_k,U_1)$ and $Q^1(SW_k,U_1)$, i.e., the estimation of fundamental active power and reactive power of appliance ai in the state s(i) under the measured fundamental terminal voltage $U_1$.

2) Establishing the constraints for initial selection of the total load operating state:

The elements of $P^1(SW_k,U_1)$ and $Q^1(SW_k,U_1)$ respectively are summed to obtain the estimation of total load fundamental active power and reactive power, which denote as $P_\Sigma^1(SW_k,U_1)$ and $Q_\Sigma^1(SW_k,U_1)$; and the constraints for initial selection of the total load operating state are established, as shown in equation (10) and (11):

$$|P_\Sigma^1(SW_k,U_1) - P_I^1(t)| \leq \eta_P \cdot P_I^1(t) \quad (10)$$

$$|Q_\Sigma^1(SW_k,U_1) - Q_I^1(t)| \leq \eta_Q \cdot Q_I^1(t) \quad (11)$$

In equation (10) and (11), $\eta_P$ and $\eta_Q$ respectively represent the threshold coefficient for active power and reactive power, which are respectively predetermined as 10% and 15%.

In order to improve the table looking-up efficiency, the present invention takes advantages of binary looking-up algorithm to search the orderly linear table [state] according to the mentioned constraints, and consequently obtaining the feasible state word space $\Omega_{SW}(P_I^1(t),Q_I^1(t)) \subset Z^N$.

IV. Step of the Optimal Matching of Current Pattern:

In the feasible state word space $\Omega_{SW}(P_I^1(t),Q_I^1(t)) \subset Z^N$ obtained in step III, which meets the constraints of the measured fundamental total active and reactive power, searching the state word $SW_{min}(t)$ corresponding to the estimated total current pattern that is closest to the measured current pattern (i.e. current harmonic-characteristics) by the matching method, and consequently taking the $SW_{min}(t)$ as the optimal estimation of the current operating state of the total load, and the $P_{min}^1(t)$ exclusively corresponding to the $SW_{min}(t)$ as the optimal estimation vector of the current fundamental total active power to reflect the operating states of appliances in the total load, and finally achieving the disaggregation of fundamental total active power.

The present invention also proposes a current pattern matching method as follows:

1) Under the Measured Fundamental Terminal Voltage $U_1$, the Vector Showing the Ratio of the Fundamental Active Power Estimation of Each Appliance to that of the Total Load is as Follows:

Obtaining the active power estimation vector $P^1(SW_k,U_1)$ according to the corresponding state word vector $SW_k$ of $\Omega_{SW}(P_I^1(t),Q_I^1(t))$ and the vector showing the ratio of the fundamental active power estimation of each appliance to that of the total load according to the following equation:

$$\beta_{P1}^1(SW_k,U_1) = (\beta_{P1,k}^{1,U_1}, \ldots, \beta_{Pi,k}^{1,U_1}, \ldots, \beta_{PN,k}^{1,U_1})^T \in R^N \quad (12)$$

In equation (12), under the measured fundamental terminal voltage $U_1$, $\beta_{Pi,k}^{1,U_1} = P_{s(i)}^{U_1} / \sum_{i=1}^{N} P_{s(i)}^{U_1} = P_{s(i)}^{U_1} / P_\Sigma^1(SW_k,U_1)$ represents fundamental active power ratio of appliance ai in the active power estimation vector $P^1(SW_k,U_1)$ corresponding to the k-th state word vector $SW_k$ in the table [state], wherein k represents the serial number of the state word vector $SW_k$ in the orderly linear table [state]. For example, if $SW_k = (1,1,0,2)^T$, then $\beta_{P1}^1(SW_k,U_1) = (0.11, 0.23, 0, 0.66)^T$ ($U_1 = 221.5V$).

2) Under the Measured Fundamental Terminal Voltage $U_1$, the Estimation Vector Describing the Proportion of the Current of Each Appliance in that of the Total Load is as Follows:

According to equation (13), calculating the current weight coefficient $\beta_{i,k}^{U_1}$, of each appliance via the fundamental phase angle parameters in the matrix of current harmonic parameters $H_a(SW_k)$ and the vector of fundamental active power ratio $\beta_{P1}^1(SW_k,U_1)$ as:

$$\beta_{i,k}^{U_1} = \frac{\beta_{Pi,k}^{1,U_1}}{\sqrt{\left(\sum_{j=1}^{N} \beta_{Pj,k}^{1,U_1}\right)^2 + \left(\sum_{j=1}^{N} \beta_{Pj,k}^{1,U_1} \cdot \tan \theta_{1,s(j)}\right)^2} \cdot \cos \theta_{1,s(i)}} \quad (13)$$

In equation (13), the subscript k represents the serial number of the state word vector $SW_k$ in the table [state], the subscript i represents appliance ai, according to equation (3), the subscript s(i) and s(j) represent the operating state of appliance ai and aj in state word vector $SW_k$. The $\theta_{1s(i)}$ is phase angle of the element of the i-th column in the first row of $H_a(SW_k)$. And the term $\beta(SW_k,U_1) = (\beta_{1,k}^{U_1}, \ldots, \beta_{i,k}^{U_1}, \ldots, \beta_{N,k}^{U_1})^T \in R^N$ is taken as the estimation vector of the current weight coefficients.

3) Estimated Current Pattern and the Objective Function of the Current Pattern Matching:

Utilizing the fundamental principle that any steady-state total load current can be approximately estimated by a linear superposition of the steady-state currents of N major electrical appliances inside the load (Refer to: Li Peng, Yu Yinxin. *Nonintrusive Method for On-Line Power Load Decomposition[J]. Journal of Tianjin University*, 2009, 42(4):303-308.), the vector of estimated unit total current harmonic parameters $\hat{I}_I(SW_k,U_1)$ can be calculated via the equation (14), which is called estimated total current pattern in the present invention.

$$\hat{I}_I(SW_k,U_1) = (H_a(SW_k)) \cdot (\beta(SW_k,U_1)) \quad (14)$$

If the measured unit total current pattern corresponding to the load total fundamental power is denoted as $I_I(P_I^1(t),Q_I^1(t))$ at time t, as shown in equation (15), the objective function of the current pattern matching in the present invention is shown in equation (16):

$$I_I(P_I^1(t),Q_I^1(t)) = (1 \cdot \angle \theta_{I1}, \ldots, \alpha_{Ih} \cdot \angle \theta_{Ih}, \ldots, \alpha_{IH} \angle \theta_{IH})^T \quad (15)$$

In equation (15), $\alpha_{Ih}$ represents per unit value of the h-th harmonic amplitude of current $i_I(t)$ with its fundamental amplitude as base value, so $\alpha_{I1} = 1$; $\theta_{Ih}$ represents the initial phase angle of the h-th harmonic of current $i_I(t)$ relative to the fundamental phase angle of load terminal voltage.

$$\min_{\forall SW_k \in \Omega_{sw}(P_I^1(t),Q_I^1(t))} \left\| I_I(P_I^1(t),Q_I^1(t)) - \hat{I}_I(SW_k,U_1) \right\|^2 \quad (16)$$

In equation (16), $\|\cdot\|$ represents the $L_2$ norm.

4) Disaggregation of Fundamental Wave Load According to the Current Matching Results:

In the feasible state word space $\Omega_{SW}(P_I^1(t),Q_I^1(t)) \subset Z^N$ mentioned above, the state word vector $SW_{min}(t)$ bringing the equation (16) to obtain the minimum value is searched and taken as the optimal estimation of the current operating state of the total load, and accordingly the appliance operating state identification is realized; and the $P_{min}^1(t)$ exclusively corresponding to the $SW_{min}(t)$ is achieved as the optimal estimation of the current power state of the total load, and finally the disaggregation of total fundamental active power is realized. Combining the equation (9), the fundamental reactive power estimation of the appliances inside the total load can be calculated, and then the disaggregation of total fundamental reactive power is completed.

V. Step of Display and Output of the Monitoring and Disaggregation Results:

Finally, the power state (i.e. electric power) and operating state of every appliance inside the total load are output and displayed.

Embodiments

Based on the worldwide achievement in this field, the present invention provides an economic and practical solution of residential electricity consumption (details) monitoring method based on solving the existing technical problems.

Figure 3:
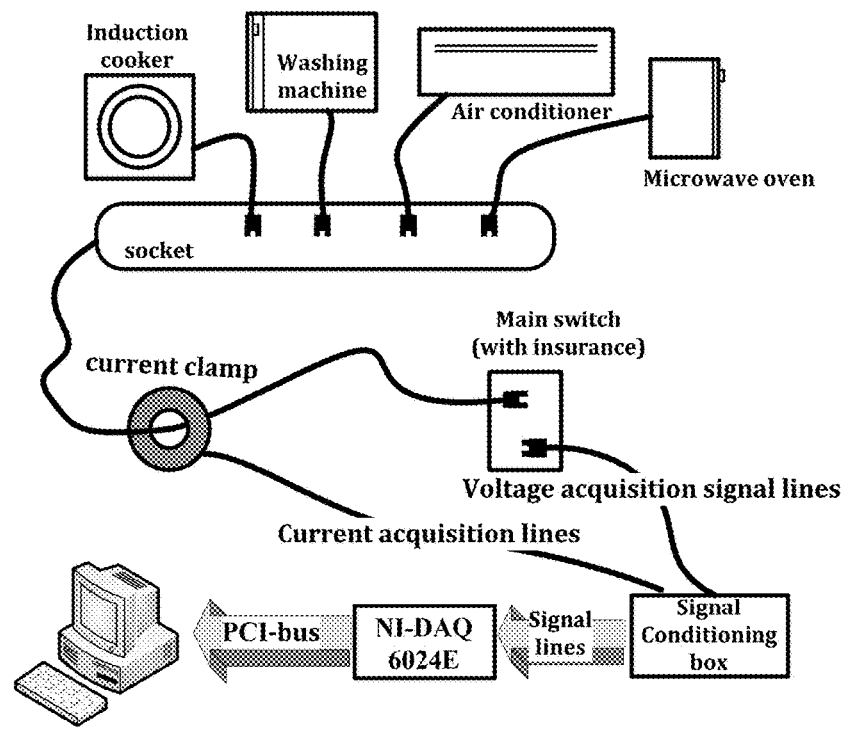
FIG. 3 shows the schematic diagram of the embodiment of the non-intrusive power load monitoring and disaggregation system proposed by the present invention.

According to the FIGS. 1 and 2, an embodiment system is established shown as FIG. 3, in which a row socket is used to simulate the house distribution circuits, and the electrical appliances to be tested are connected to the socket. For the convenience of implementation, a current clamp is clamped on power line of row socket to sample the total load current. Both voltage sensor used for acquiring the load terminal voltage and isolating protective circuits are embedded in signal conditioning box. The obtained voltage and total current are transmitted to a computer for further processing via a data acquisition card, the data acquisition card links the computer storing monitoring system program and the load signature database via PCI bus. Wherein, the data acquisition card is the DAQCard-6024E data acquisition card of NI company, the computer is a laptop with basic frequency of 1.60 GHz.

The partial load characteristic information of the appliances is listed in table 1, the measured voltage-current waveforms are illustrated in FIG. 4 to FIG. 7. The value of $\eta_P$ and $\eta_Q$ are respectively predetermined as 10% and 15%, and only the previous 11 harmonics of appliance current are considered.

As shown in FIG. 2, the specific implementation for the method of the present invention mainly includes the following five steps, which are: electrical appliance registration and initialization of load state word space $\Omega_{SW}$, data acquisition and data preprocessing, feasible state word space search based on table looking-up, the optimal matching of current pattern (i.e. current harmonic-characteristics) and display and output of the monitoring and disaggregation results. As shown in FIG. 2, off-line statistical analysis of the measured load data can be used to supplement and update the content of the load signature database.

Electrical appliance registration and initialization of load state word space: as mentioned before, in order to implement the non-intrusive power load monitoring method of the present invention, electrical appliance registration is required after establishing the load signature database, that is to say, the composition of the electrical appliances inside the house is determined and the required load characteristic information for the implementing the monitoring method is obtained. For facilitating the customers and guaranteeing the practicability of the non-intrusive monitoring scheme, decreasing the participation of customers and reducing the complexity of the necessary operation (appliance registration for example) are needed. On the basis of electrical appliance registration, the orderly linear table [state] can be obtained once the initialization of load state word space is finished, which can be consolidated in the storage module of the monitoring system.

Data acquisition and data preprocessing: the acquisition of the customer load terminal voltage and electricity total current and data preprocessing are the basis of implementing the non-intrusive power load monitoring, which have a direct effect on the performance of the monitoring method. Wherein, data preprocessing comprises denoising and harmonic analysis of the measured voltage and total current signal, which provides the measured total fundamental active power $P_I^1(t)$, total fundamental reactive power $Q_I^1(t)$ (see the equation (6) and equation (7)) and unit total current pattern $I_I(P_I^1(t),Q_I^1(t))$ (see the equation (15)).

Feasible state word space search based on table looking-up: searching the orderly linear table [state] to complete the initial selection of the total load operating state, and consequently obtaining the feasible state word space $\Omega_{SW}(P_I^1(t), Q_I^1(t)) \subset Z^N$ meeting the fundamental total power constraints.

The optimal matching of current pattern: in the feasible state word space $\Omega_{SW}(P_I^1(t),Q_I^1(t)) \subset Z^N$ meeting the constraints of the measured fundamental total active and reactive power obtained from the last step, the state word $SW_{min}(t)$ corresponding to the estimated total current pattern that is closest to the measured current pattern (current harmonic-characteristics) is search by the matching method, which serves as the optimal estimation of the current operating state of the total load, and the $P_{min}^1(t)$ exclusively corresponding to the $SW_{min}(t)$ serves as the optimal estimation vector of the current total fundamental active power, so far the disaggregation of total fundamental active power is completed; further combining the equation (9), the fundamental reactive power estimation of the appliances inside the total load can be calculated, and then the disaggregation of total fundamental reactive power is completed.

Display and output of the monitoring and disaggregation results: results of the embodiment are shown in table 2.

TABLE 2

Example test results

| | Appliance (sign) | Actual state/ Monitored state | Actual power | Monitor result | Absolute error | Relative error |
|---|---|---|---|---|---|---|
| 1 | Washing machine/X | 0/0 | 0 | 0 | 0 | NaN |
| | Microwave oven/W | 1/1 | 1346 W | 1292 W | −54 W | −4.01% |
| | | | 180 var | 175 var | −5 var | −2.78% |
| | Air condition/K | 1/1 | 489 W | 469 W | −20 W | −4.09% |
| | | | 189 var | 182 var | −7 var | −3.70% |
| | Induction cooker/D | 0/0 | 0 | 0 | 0 | NaN |

TABLE 2-continued

Example test results

| | Appliance (sign) | Actual state/ Monitored state | Actual power | Monitor result | Absolute error | Relative error |
|---|---|---|---|---|---|---|
| 2 | Washing machine/X | 1/1 | 244 W | 238 W | −6 W | −2.46% |
| | | | 57 var | 55 var | −2 var | −3.51% |
| | Microwave oven/W | 0/0 | 0 | 0 | 0 | NaN |
| | Air condition/K | 2/2 | 799 W | 781 W | −18 W | −2.25% |
| | | | 207 var | 200 var | −7 var | −3.38% |
| | Induction cooker/D | 1/1 | 901 W | 880 W | −21 W | −2.33% |
| | | | −76 var | −77 var | −1 var | 1.32% |
| 3 | Washing machine/X | 1/1 | 231 W | 222 W | −9 W | −3.90% |
| | | | 50 var | 51 var | 1 var | 2.00% |
| | Microwave oven/W | 1/1 | 1171 W | 1120 W | −51 W | −4.35% |
| | | | 158 var | 152 var | −6 var | −3.80% |
| | Air condition/K | 1/1 | 489 W | 468 W | −21 W | −4.29% |
| | | | 190 var | 182 var | −8 var | −4.21% |
| | Induction cooker/D | 3/3 | 1695 W | 1632 W | −63 W | −3.72% |
| | | | −241 var | −234 var | 7 var | −2.90% |
| 4 | Washing machine/X | 0/0 | 0 | 0 | 0 | NaN |
| | Microwave oven/W | 1/1 | 1206 W | 1200 W | −6 W | −0.50% |
| | | | 167 var | 163 var | −4 var | −2.40% |
| | Air condition/K | 2/2 | 825 W | 821 W | −4 W | −0.48% |
| | | | 214 var | 210 var | −4 var | −1.87% |
| | Induction cooker/D | 2/2 | 1323 W | 1317 W | −6 W | −0.45% |
| | | | −190 var | −188 var | 2 var | −1.05% |

Remark: the state word '1' of air conditioner in the table refers to the cooling state in table 1. The rest is the same.

The testing results of embodiment are analyzed as follows:

1. The embodiment has verified the effectiveness of the solution of this present invention. In the embodiment, the identification accuracy rate of appliance operating state is 100%, and the absolute deviation of total power disaggregation result is below 5%, both of which meet the engineering needs.

Figure 4:
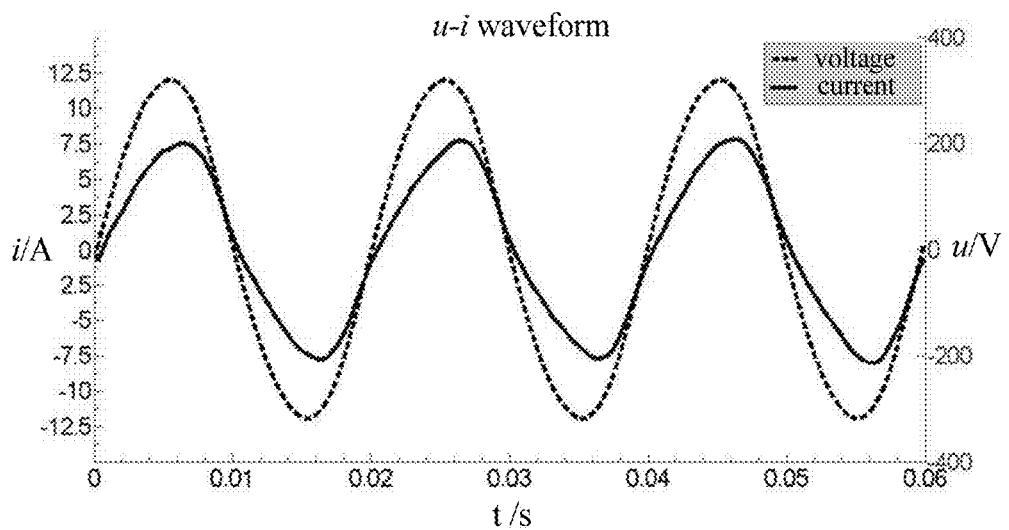
FIG. 4 shows the measured waveform of the air conditioner heating state.
Figure 5:
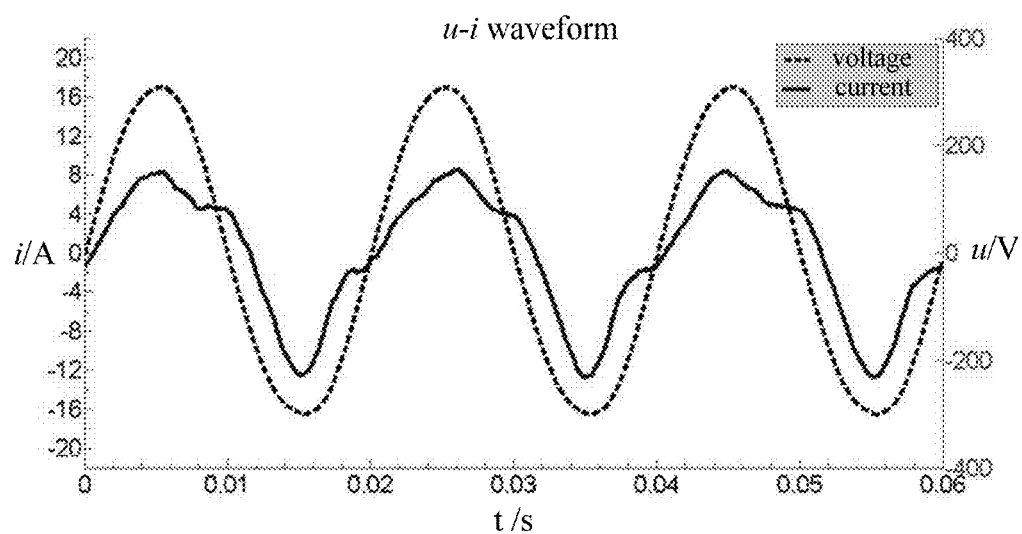
FIG. 5 shows the measured waveform of the high-fire heating state of microwave oven.
Figure 6:
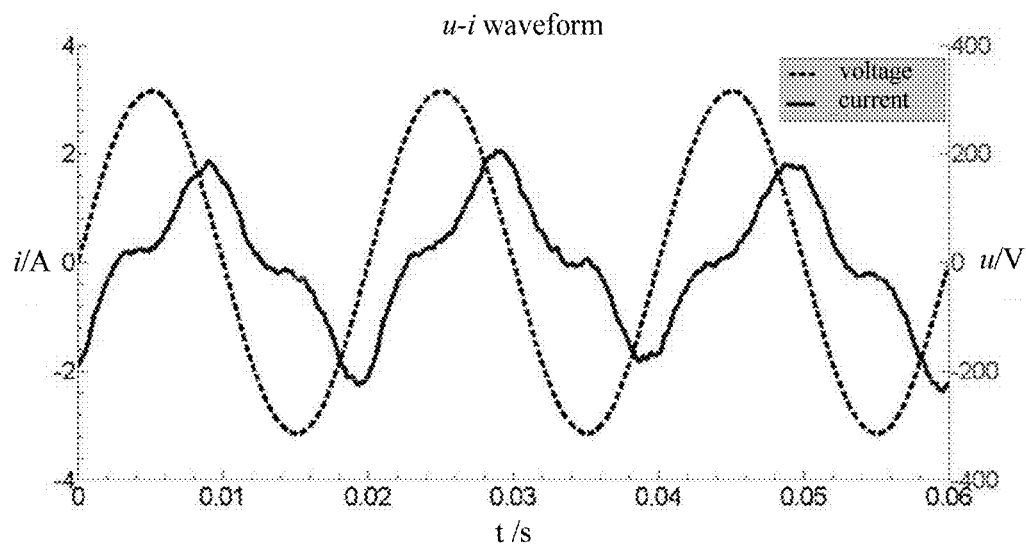
FIG. 6 shows the measured waveform of the washing state of washing machine.
Figure 7:
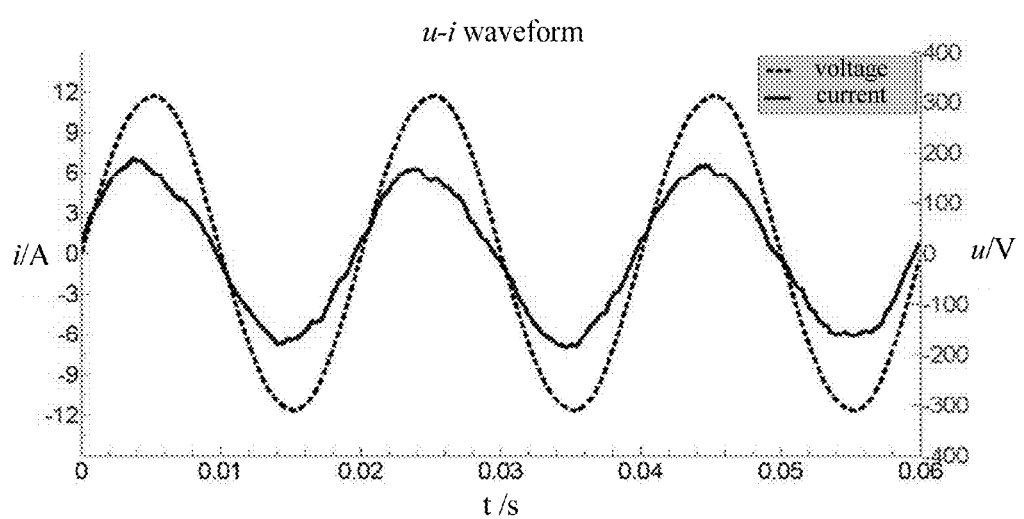
FIG. 7 shows the measured waveform of the rice-cooking state of induction cooker.

2. Based on the measurement in actual environment, the current waveform of air conditioner heating mode is similar to that of induction cooker as shown in FIGS. 4 and 7. The second case in table 2 shows that the monitoring result is not disturbed when these two appliance are simultaneously operating, that is to say the method of this present invention is not sensitive to similarity of current waveform between appliances, and the disaggregation accuracy of total power will not decrease when the measured current waveforms of different appliances have great similarity.

Since there is a power difference of 8.84% between the heating state of microwave oven and the hot-pot cooking state of induction cooker, the fourth case indicates the monitoring result still has a high-accuracy, which shows the disaggregation deviation is not affected by the similar appliance power, and not sensitive to the reasonable variation of load power, therefore the present invention can accurately distinguish the different operating states with similar load power levels.

Although the present invention has been described combined with the tables and figures, it isn't restricted to concrete embodiment above. In other words, the concrete embodiment above is not restrictive but only schematic. In the enlightenment of this present invention, general technician in this field can make many other variants and further develop embedded systems without any deviation from the core aim of this invention, such as, embedding the method into local smart meters, or transmitting locally-acquired electrical signal to the remote data analysis server and developing monitoring function on the basis of this present invention. All of the above are preserved in this invention.

The invention claimed is:

1. A harmonic-characteristics based current pattern matching method performed with a monitor device for the non-intrusive power load monitoring, comprising steps:

(a) establishing a load signature database of household appliances, said database comprising information about (i) power states and operating states which each appliance of said various appliances has, and (ii) steady-state current harmonic parameters of each of said operating states of each said appliance;

(b) registering all electrical appliances inside a total household load and initializing a linear load state word space table in an on-board memory module of said monitor device by (i) acquiring load characteristic information for each of said electrical appliances from said load signature database and (ii) performing statistical analysis on all possible operating states of said total household load and storing results of said statistical analysis in said memory module in the form of a linear state word table;

(c) performing data acquisition and data preprocessing by measuring terminal voltage and steady-state total current of said household load, which are then processed in a processing module in said monitor device to obtain a measured total fundamental active power value, a total fundamental reactive power value and a unit total current pattern;

(d) performing a looking-up search on said linear state word table to obtain a feasible state word space based on said measured total fundamental active power value and said total fundamental reactive power value;

(e) performing an optimal matching of current pattern based on the following equation:

$$\min_{\forall SW_k \in \Omega_{sw}(P_l^1(t), Q_l^1(t))} \left\| I_l(P_l^1(t), Q_l^1(t)) - \hat{I}_l(SW_k, U_1) \right\|^2$$

to obtain corresponding $SW_{min}(t)$ and $P^1_{min}(t)$ values in said feasible state word space and, by disaggregating said total fundamental active power value based on said $SW_{min}(t)$ and $P^1_{min}(t)$ values, to obtain the information of the power state and operating state for each of said electrical appliances inside said household load at the given point of time when terminal voltage and steady-state total current of said household load are measured; and (f) displaying said information of the power state and operating state on a screen of said monitor device;

wherein in step (a) said steady-state current harmonic parameters in step (a) is determined based on the following equation:

$$H_{ai} = \begin{bmatrix} 1\angle\theta_{1,1} & \cdots & 1\angle\theta_{1,s(i)} & \cdots & 1\angle\theta_{1,Si} \\ \vdots & \cdots & \vdots & \cdots & \vdots \\ \alpha_{h,1}\angle\theta_{h,1} & \cdots & \alpha_{h,s(i)}\angle\theta_{h,s(i)} & \cdots & \alpha_{h,Si}\angle\theta_{h,Si} \\ \vdots & \cdots & \vdots & \cdots & \vdots \\ \alpha_{H,1}\angle\theta_{H,1} & \cdots & \alpha_{H,s(i)}\angle\theta_{H,s(i)} & \cdots & \alpha_{H,Si}\angle\theta_{H,Si} \end{bmatrix}$$

where ai is appliances, Si is operating states of each appliance, H is the maximum harmonic order, h is harmonic order, $\alpha_{h,s(i)}$ or per unit value of h-th harmonic amplitude of steady-state current under state s(i) of applicance ai with it fundamental amplitde as base value, $\theta_{h,s(i)}$ is initial phase angle of h-th harmonic of steady-state current under state s(i) of appliance ai relative to fundamental phase angle of appliance terminal voltage measured;

wherein in step (b) said statistical analysis is performed on total load power state, which is expressed as power vectors $P1(t) \ R^N$ and $Q1(t) \ R^N$, consisting of fundamental powers consumed by N appliances as determined by the following two equations:

$P^1(t) = (P^1_1, \ldots P^1_i, \ldots P^1_N)^T$ and $Q^1(t) = (Q^1_1, \ldots Q^1_i, \ldots Q^1_N)^T$, where superscript "1" is fundamental wave, N is the number of appliances inside said total load, i is individual appliance ai; said statistical analysis is performed further on N-dimensional state word vector SW(t) $Z^N$ as expressed in equation: $SW(t) = (s(1), \ldots, (s)(i), \ldots s(N))^T$, which represent all possible operating states of said total household load and stored in a linear table in an order according to a reference value of total fundamental active power corresponding to each state word vector; and wherein in step(c) said measured total fundamental active power $P^1_t(t)$ equals to $U_1 I_1 \cos(\theta_{i1})$, said measured total fundamental reactive power $Q^1_t(t)$ equals to $U_1 I_1 \sin(_{i1})$, and said unit total current pattern $Il(P^1_t(t), Q^1_t(t))$ equals to $(1 \cdot \angle\theta_{i1}, \ldots, \alpha_{ih} \cdot \angle\theta_{ih}, \ldots \alpha_{iH} \cdot \angle_{iH})^T$, where U1 is fundamental wave RMS-value of measured load terminal voltage u(t), $I_1$ is fundamental wave RMS-value of measured load total current i(t), $_{i1}$ is initial phase angle of fundamental wave of current $i_t(t)$ relative to fundamental phase angle of load terminal voltage, $_{ih}$ is per unit value of h-th harmonic amplitude of current $i_t(t)$ with its fundamental amplitude as base value, $_{ih}$ is initial phase angle of h-th harmonic of current $i_t(t)$ relative to fundamental phase angle of load terminal voltage.

2. The method according to claim 1, wherein in step(a) the power state and operating state of different appliances under the fundamental wave reference voltage $U_{ref}$ are determined according to the following rules: different appliances are measured to determine all possible steady-state electric power, and the measured electric power levels are references to the corresponding different power states, expressed as $P_{ref}$; different power states correspond to different operating states; and if an appliance has the same electric power level under different physical states, these different physical states are jointly defined as one operating state.

\* \* \* \* \*